United States Patent
Nguyen et al.

(10) Patent No.: US 10,651,795 B2
(45) Date of Patent: May 12, 2020

(54) METHOD OF AMPLIFYING AN INPUT SIGNAL

(71) Applicant: Fraunhofer-Gesellschaft zur Foerderung der angewandten Forschung e.V., Munich (DE)

(72) Inventors: Hung-Anh Nguyen, Berlin (DE); Wilhelm Keusgen, Berlin (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 0 days.

(21) Appl. No.: 15/710,480

(22) Filed: Sep. 20, 2017

(65) Prior Publication Data
US 2018/0013388 A1    Jan. 11, 2018

Related U.S. Application Data

(63) Continuation of application No. PCT/EP2016/056956, filed on Mar. 30, 2016.

(30) Foreign Application Priority Data

Mar. 31, 2015 (EP) .................... 15161959

(51) Int. Cl.
  *H03F 3/217* (2006.01)
  *H03F 1/02* (2006.01)
(52) U.S. Cl.
  CPC ............ *H03F 1/0205* (2013.01); *H03F 1/02* (2013.01); *H03F 3/2175* (2013.01); *H03F 2200/171* (2013.01); *H03F 2200/78* (2013.01)

(58) Field of Classification Search
  CPC ...... H03F 1/0205; H03F 3/2175; H03F 3/217; H03F 3/2171; H03F 3/2173;
  (Continued)

(56) References Cited

U.S. PATENT DOCUMENTS 4,646,359 A    2/1987 Furrer
5,909,460 A *  6/1999 Dent ..................... H01Q 3/26
                                             342/383
(Continued)

FOREIGN PATENT DOCUMENTS

DE         10012539 A1    9/2001
EP         1328071 A1     7/2003
(Continued)

*Primary Examiner* — Khanh V Nguyen
(74) *Attorney, Agent, or Firm* — Perkins Coie LLP; Michael A. Glenn

(57) ABSTRACT

A method and a device for amplifying an input signal include a power amplifier for amplifying a binary input signal, a modulation device for generating the binary input signal on the basis of the input signal, the input signal being a complex-valued signal and the binary input signal being a real-valued signal, the modulation device including an adding device configured to add the complex-valued input signal to a complex-valued carrier signal of a predefined frequency and to thus generate a resulting complex-valued signal, and the modulation device including a combination device connected downstream from the adding device and configured to generate the real-valued binary input signal from the real part and the imaginary part of the resulting complex-valued signal by combining the real part and the imaginary part of the resulting complex-valued signal.

11 Claims, 6 Drawing Sheets

(58) Field of Classification Search
CPC ............... H03F 2200/432; H03F 3/38; H03F 2200/351; H03F 1/04; H03F 1/34; H03M 1/504; H03M 1/822; H04L 25/4902
USPC ...................................... 330/10, 251, 207 A
See application file for complete search history.

(56) References Cited

U.S. PATENT DOCUMENTS

| | | | | |
|---|---|---|---|---|
| 6,339,621 | B1* | 1/2002 | Cojocaru | H04L 27/362 375/247 |
| 7,126,999 | B2* | 10/2006 | Dent | H03C 3/40 375/261 |
| 7,403,761 | B2* | 7/2008 | Ashby | H03D 7/166 342/13 |
| 7,738,597 | B2* | 6/2010 | Smaini | H03D 7/1433 332/103 |
| 8,724,733 | B2* | 5/2014 | Ghannouchi | H03F 3/217 375/295 |
| 8,803,608 | B2* | 8/2014 | Nguyen | H03F 3/217 330/207 A |
| 2004/0015246 | A1 | 1/2004 | Gamm et al. | |
| 2014/0009231 | A1 | 1/2014 | Nguyen et al. | |

FOREIGN PATENT DOCUMENTS

| | | |
|---|---|---|
| EP | 2498397 A1 | 9/2012 |
| JP | 60241354 A | 11/1985 |

\* cited by examiner

METHOD OF AMPLIFYING AN INPUT SIGNAL

CROSS-REFERENCE TO RELATED APPLICATIONS

This application is a continuation of copending International Application No. PCT/EP2016/056956, filed Mar. 30, 2016, which is incorporated herein by reference in its entirety, and additionally claims priority from European Application No. EP 15161959.0, filed Mar. 31, 2015, which is also incorporated herein by reference in its entirety.

BACKGROUND OF THE INVENTION

In the field of electronics, and in particular in the field of wireless communication, there are many applications wherein bandpass signals may be generated and amplified. A bandpass signal is an electric signal wherein the spectral energy is limited to a specific bandwidth around a carrier frequency. A bandpass signal has no DC component and no spectral components above a certain cutoff frequency. The bandwidth typically amounts to a specific percentage of the carrier frequency.

In most applications, a bandpass signal is generated by means of digital signal processing, the signals being represented as complex-valued digital baseband signals. A digital baseband signal has two components. A real part and an imaginary part, or an I component and a Q component. Typically, the digital I and Q signals are converted to real-valued analog low-pass signals and transferred to the bandpass domain by means of an IQ mixer or a vector modulator operated with a harmonic signal of a carrier frequency. Accordingly, the IQ mixer may be regarded as a frequency converter, and its function may be regarded as frequency conversion.

Generally, a bandpass signal has a non-constant envelope determined by the peak-to-mean ratio. In many cases, the bandpass signal may be amplified by means of an amplifier device.

A power amplifier is a device comprising two terminals, one terminal for the input signal and one terminal for the output signal. An auxiliary power source is used for generating an output signal that has a higher power as compared to the input signal.

An amplifier is implemented by means of amplifier devices such as transistors or tubes. Said amplifier devices are typically nonlinear. In most technical applications such as wireless communication, for example, it is useful to avoid nonlinear distortion of the output signal, however, since said distortions create undesired emissions outside of as well as distortions within the frequency band.

An almost perfectly linear behavior is achieved by operating the amplifier element with small signal amplitudes as compared to the amplitude which is maximally admissible for said element. An increase in the input signal amplitude results in a further increase of the nonlinear behavior, the highest signal values within the output signal being slightly compressed. However, the output signal still has a variable value, and the amplifier may be referred to as being weakly nonlinear.

In contrast to this, a highly nonlinear behavior results in a firmly limited amplitude of the output signal, said output signal being constant and independent of the input quantity. Such a signal merely has two states which correspond with the sign function of the input signal, and it will be referred to as a binary signal below.

Examples of amplifiers comprising almost no or only slight nonlinearity are class-A or class-B amplifiers. Examples of highly nonlinear amplifiers are class-D and class-E amplifiers such as digital line drivers and pulse amplifiers. Said strictly nonlinear amplifiers will be referred to as switching amplifiers below since the amplifier essentially acts as a switching current source triggered by the sign function of the input signal.

The efficiency of an amplifier is defined as the ratio of the average power of the output signal to the input power, the input power in turn being the average power provided by the auxiliary power source and added to the power of the input signal. The efficiency of a weakly nonlinear amplifier is comparatively low and decreases further for signals having a high peak-to-mean ratio.

In contrast to this, switching amplifiers exhibit an efficiency, or efficiency factor, of almost 1, which is due to the fact that ideally, the voltage applied across, or the current flowing through, the switching element is zero at any time. From the point of view of energy efficiency, a switching amplifier is therefore advantageous.

However, what is disadvantageous is that a switching amplifier by definition removes any amplitude information from the input signal. This is why the amplitude of the input signal may be maintained by additionally using a pulse modulation scheme at the input of the amplifier, which results in a binary input signal, any information being inserted in the zero crossings of the signal.

On the output side, additional demodulation of the amplified binary signal may be used for reconstructing the original signal. In addition, modulation creates undesired spectral components outside the frequency band, which may expediently be suppressed by demodulation. On the other hand, the entire system—modulator, switching amplifier, demodulator—would by definition not behave like a linear power amplifier.

In order to obtain undistorted, i.e., linear, amplification of the signal curve, the amplifier device may expediently be operated with a certain headroom, i.e., with a power back-off, which in turn reduces the power efficiency of the amplifier, however. Otherwise, the amplifier will distort the bandpass signal in a nonlinear manner and thus produce undesired distortions within the frequency band as well as emissions outside the frequency band.

The insufficient power efficiency of amplifiers for bandpass signals, which in modern wireless communication signals may amount to only 10 percent or less, results in an increased need for new amplifier concepts. Current approaches employing adaptive digital filter pre-distortions demonstrate that there is a considerably augmented need for using hardware. This is why, additionally, there is a need for integrated solutions involving reduced hardware complexity.

Several approaches have been known in terms of increasing the power efficiency for bandpass amplifiers. At the circuit level, Doherty topology provides higher efficiency for high-power back-off values. Elimination and restoration of envelopes, as well as bias voltage modulation are further techniques at the system level which are aimed at increasing efficiency within the back-off region. Analog feed-forward and feed-back circuitry may be used for improving the linearity of low back-offs, which will also increase power efficiency. In contrast thereto, closed-loop digital pre-distortion is implemented at the system level and exhibits more pronounced improvements in the linearity for signals having comparatively large bandwidths. In addition, it is suited to adapt temporal changes in the amplifier device.

While the approaches mentioned are designed to improve amplifiers having essentially linear behavior, the switching-amplifier techniques are intended to transfer bandpass signals to a sequence of rectangular, binary pulses which may be amplified with a theoretical efficiency of 100 percent. Following amplification, the original bandpass signal is reconstructed by means of low-pass filtering.

From a technical point of view, transformation and reconstruction may be considered to be a pulse modulation and demodulation problem. One known switching-amplifier technique uses pulse width modulation (PWM), which is a feed-forward modulation scheme. A further known switching-amplifier technique uses Sigma-Delta modulation (SDM), which is a closed-loop modulation scheme.

However, both have the disadvantage of causing signal distortions within the frequency band which cannot be removed by the demodulator. Said signal distortions may be reduced by increasing the switching frequency, by oversampling or by means of higher-order loop-back filtering (for SDM). This increases the requirement placed upon the amplifier device and, therefore, the cost of switching amplifiers, specifically for operation at high signal frequencies, which are typical at radio frequencies and in microwave applications. In addition, due to its feedback delay the closed-loop architecture of Sigma-Delta modulation tends to create problems of instability at very high operating frequencies.

SUMMARY

According to an embodiment, a device for amplifying an input signal may have: a power amplifier for amplifying a binary input signal, a modulation device for generating the binary input signal on the basis of the input signal, the input signal being a complex-valued signal and the binary input signal being a real-valued signal, the modulation device including an adding device configured to add the complex-valued input signal to a complex-valued carrier signal of a predefined frequency and to thus generate a resulting complex-valued signal, and the modulation device including a combination device connected downstream from the adding device and configured to generate the real-valued binary input signal from the real part and the imaginary part of the resulting complex-valued signal by combining the real part and the imaginary part of the resulting complex-valued signal.

According to another embodiment, a method of amplifying an input signal may have the steps of: amplifying a binary input signal, generating the binary input signal on the basis of the input signal, the input signal being a complex-valued signal and the binary input signal being a real-valued signal, adding the complex-valued input signal to a complex-valued carrier signal of a predefined frequency for generating a resulting complex-valued signal, and generating the real-valued binary input signal from the real part and the imaginary part of the resulting complex-valued signal by combining the real part and the imaginary part of the resulting complex-valued signal.

In accordance with an embodiment of the invention, what is proposed is a device for amplifying an input signal which comprises, inter alia, a power amplifier for amplifying a binary input signal. The inventive device further comprises a modulation device for generating the binary input signal on the basis of the input signal, the input signal being a complex-valued signal and the binary input signal being a real-valued signal. The modulation device comprises an adding device configured to add the complex-valued input signal to a complex-valued carrier signal of a predefined frequency and to thus generate a resulting complex-valued signal. The modulation device further comprises a combination device connected downstream from the adding device and configured to generate the real-valued binary input signal from the real part and the imaginary part of the resulting complex-valued signal by combining the real part and the imaginary part of the resulting complex-valued signal.

In some inventive embodiments, the modulation device is configured, among other things, to generate a digital input signal for the power amplifier on the basis of the input signal, which may be a real-valued baseband signal, a complex-valued baseband signal, a real-value bandpass signal, or a complex-valued bandpass signal, for example. The digital input signal generated is within a predefined frequency band. Distortions arising, e.g., in the generation of the digital input signal for the power amplifier, however, are at a frequency outside the predefined frequency range. Thus, the digital input signal exhibits no distortions within the predefined frequency band, or within the frequency spectrum of the desired digital input signal to be amplified by the power amplifier. In addition, the power amplifier provides amplification of the digital input signal with increased power efficiency. Moreover, since the distortions are not within the predefined frequency band of the digital input signal, a high level of linearity may be achieved in the amplification, for example by performing reconstruction filtering on the amplified digital input signal (output signal of the power amplifier). Thus, distortions outside the frequency band, i.e., frequencies above the predefined frequency band, are reduced or eliminated without modifying the desired signal portion in the process.

BRIEF DESCRIPTION OF THE DRAWINGS

Embodiments of the present invention will be detailed subsequently referring to the appended drawings, in which.

DETAILED DESCRIPTION OF THE INVENTION

For the purposes of the following description of the inventive embodiments with reference to the figures, complex-valued signals are depicted by a double arrow in the figures. The individual portions, i.e., the real parts and the imaginary parts of said complex-valued signals are depicted by single arrows.

Figure 1:
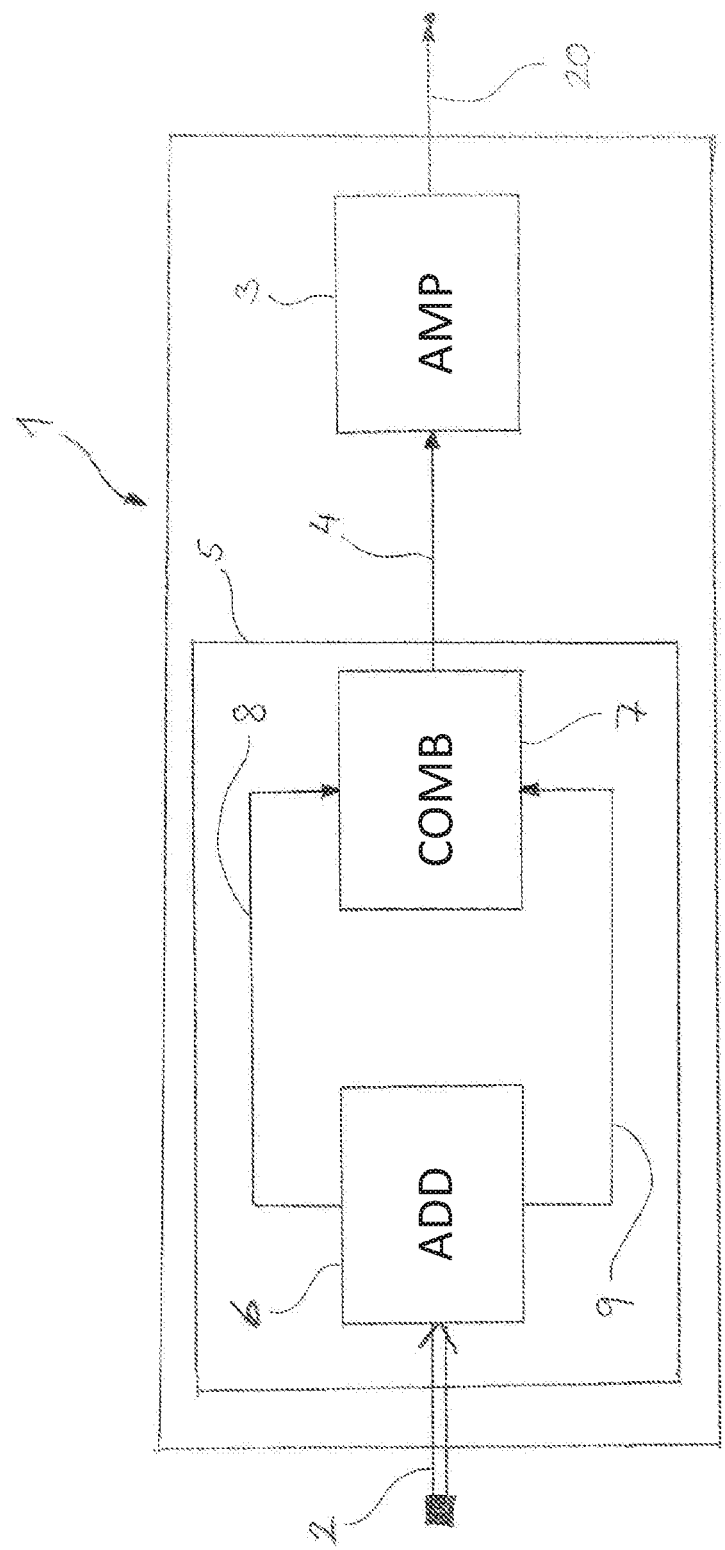
FIG. 1 shows a schematic block diagram of an inventive device.

FIG. 1 shows an inventive device 1 for amplifying an input signal 2. The input signal 2 is complex-valued, i.e., the input signal 2 comprises a real part and an imaginary part.

The device 1 comprises a switching, or power, amplifier 3. The power amplifier 3 is configured to amplify a real-valued binary input signal 4.

The device 1 moreover comprises a modulation device 5. The modulation device 5 is configured to generate the real-valued binary input signal 4 of the power amplifier 3 on the basis of the complex-valued input signal 2.

To this end, the modulation device 5 comprises an adding device 6, among other things. The adding device 6 is configured to add the complex-valued input signal 2 to a complex-valued carrier signal of a predefined frequency and to thus generate a resulting complex-valued signal. Said modulated signal comprises a real part 8 and an imaginary part 9.

The modulation device 5 further comprises a combination device 7 connected downstream from the adding device 6. The combination device 7 is configured to generate the real-valued binary input signal 4 from the real part 8 and the imaginary part 9 of the resulting modulated complex-valued signal. For this purpose, the combination device 7 is configured to generate the input signal 4 by suitably combining the real part 8 and the imaginary part 9 of the modulated signal.

Therefore, the input signal 4 of the power amplifier 3 which is generated in this manner at the same time is the output signal of the modulation device 5, or of the combination device 7.

The power amplifier 3 amplifies the input signal 4, so that an output signal 20 of the power amplifier 3 is generated which is an amplified signal, or an amplified version of the binary input signal 4.

Figure 2:
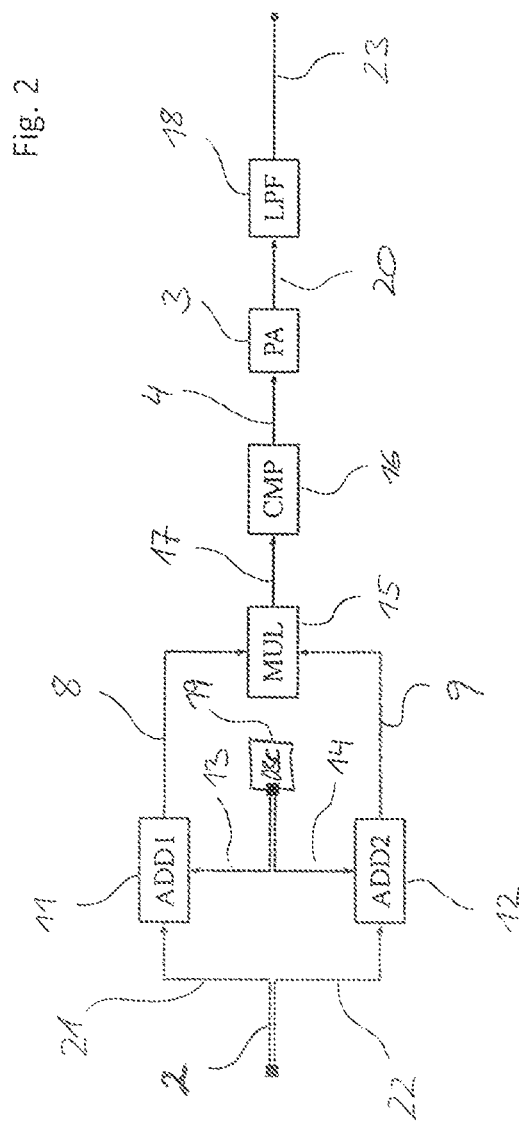
FIG. 2 shows a schematic block diagram of a first embodiment of the inventive device.

FIG. 2 shows a first embodiment of the inventive amplifier device 1. The input signal 2 is complex-valued and comprises a real part 21 and an imaginary part 22. The input signal 2 may be time-continuous or time-discrete. In the first embodiment described with reference to FIG. 2, the input signal 2 is a complex-valued time-continuous signal.

The amplifier device 1 comprises an oscillator 19 for generating a carrier signal 13, 14 having a carrier frequency $f_c$. The carrier signal 13, 14 is complex-valued and comprises a real part 13 and an imaginary part 14.

The oscillator 19 may be an analog or a digital oscillator for generating an analog or a digital signal. The first embodiment of the invention, which is depicted in FIG. 2, will be described as including an analog oscillator 19 by way of example.

The adding device 6 comprises a first adder 11 and a second adder 12. The first adder 11 is configured to add the real part 21 of the input signal 2 to the real part 13 of the carrier signal. Thus, the real part 8 of a resulting modulated signal is obtained at the output of the first adder 11.

The second adder 12 is configured to add the imaginary part 22 of the input signal 2 to the imaginary part 14 of the carrier signal. Thus, the imaginary part 9 of a resulting modulated signal is obtained at the output of the second adder 12.

The amplifier device 1 further comprises a multiplier 15 and a comparator 16. In accordance with the first embodiment of the invention, the multiplier 15 is connected downstream from the previously described adders 11, 12. The comparator 16 is connected downstream from the multiplier 15.

Both the real part 8 of the modulated output signal of the first adder 11 and the imaginary part 9 of the modulated output signal of the second adder 12 are forwarded into the multiplier 15, where they are combined to form a real-valued analog output signal 17.

Said real-valued analog output signal 17 of the multiplier 15 at the same time is the input signal of the comparator 16. The comparator 16 is configured to generate a real-valued binary signal 4 from the real-valued analog output signal 17. The output signal 4 of the comparator 16 is the binary input signal 4 of the power amplifier 3. The binary signal 4 is binary in terms of the amplitude, and is time-continuous. The binary signal 4 serves to control the power components of the power amplifier 3.

The power amplifier 3 generates an amplified output signal 20, which is an amplified version of the binary input signal 4.

The amplifier device 1 may further comprise a reconstruction filter 18. In the first embodiment depicted in FIG. 2, said reconstruction filter 18 is a low-pass filter 18 connected downstream from the power amplifier 3. Within the reconstruction filter 18, the binary signal 20 is reconstructed to form an output signal 23. If the input signal 2 equals Z(t) and the carrier frequency equals $f_c$, the output signal 23 will have the following signal shape without any further amplification factor:

$$Re\{Z(t)\}*Im\{e^{j2\pi f_c t}\}+Im\{Z(t)\}*Re\{e^{j2\pi f_c t}\}=Im\{Z(t)*e^{j2\pi f_c t}\}$$

In accordance with the embodiment depicted, the reconstruction filter 18, therefore, is serially connected downstream from the power amplifier 3, and the input signal 20 of the reconstruction filter 18 is the amplified output signal 20 generated by the power amplifier 3. According to the invention, the out-of-band signal portion of the amplified binary signal 20 is thus filtered out.

Generally, the amplified binary signal 20 consists of an inband signal portion and an out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated (up-converted) at the carrier frequency fc, of the base band input signal 2 of the entire inventive device 1.

Figure 3:
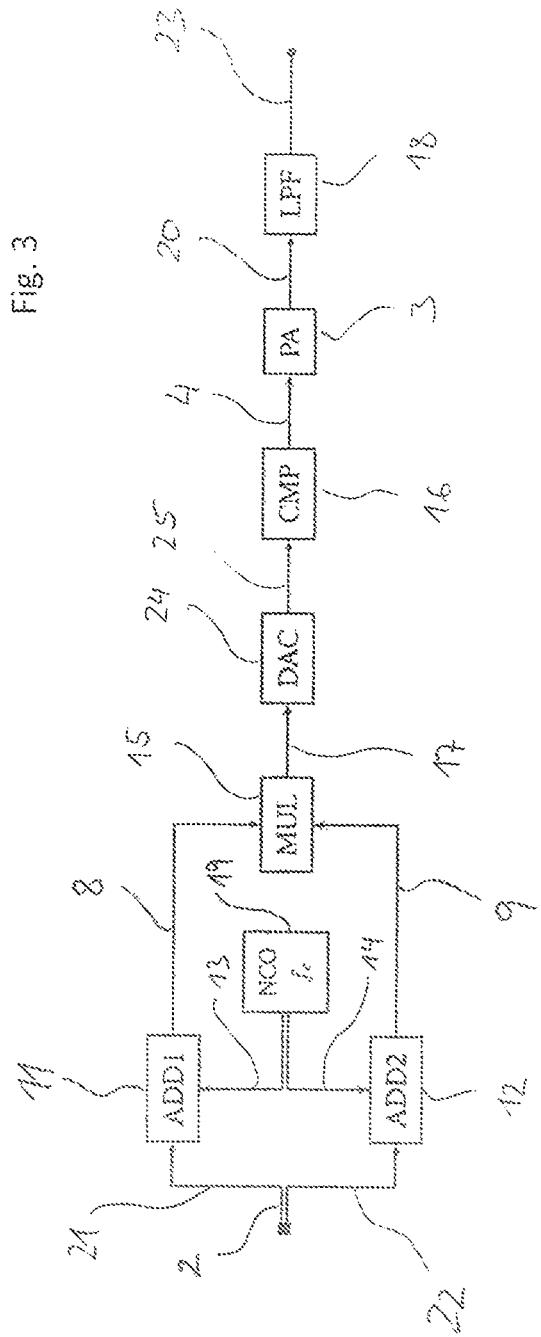
FIG. 3 shows a schematic block diagram of a second embodiment of the inventive device.

FIG. 3 shows a second embodiment of the inventive amplifier device 1. The input signal 2 is complex-valued and comprises a real part 21 and an imaginary part 22. The input signal 2 may be time-continuous, or analog, or rather time-discrete, or digital. In the second embodiment described with reference to FIG. 3, the input signal 2 is a complex-valued time-discrete signal.

The amplifier device 1 comprises a digital, numerically controlled oscillator 19 for generating a digital carrier signal 13, 14 having a carrier frequency $f_c$. The carrier signal 13, 14 is complex-valued and comprises a real part 13 and an imaginary part 14.

The adding device 6 comprises a first adder 11 and a second adder 12. The first adder 11 is configured to add the real part 21 of the input signal 2 to the real part 13 of the carrier signal. Thus, the real part 8 of a resulting modulated signal is obtained at the output of the first adder 11.

The second adder 12 is configured to add the imaginary part 22 of the input signal 2 to the imaginary part 14 of the carrier signal. Thus, the imaginary part 9 of a resulting modulated signal is obtained at the output of the second adder 12.

In accordance with this embodiment, the combination device 7 comprises a series connection consisting of a multiplier 15, a digital-to-analog converter 24 connected downstream from the multiplier 15, and a comparator 16 connected downstream from the digital-to-analog converter 24.

The multiplier 15 is connected downstream from the previously described adders 11, 12. Both the real part 8 of the modulated output signal of the first adder 11 and the imaginary part 9 of the modulated output signal of the second adder 12 are forwarded into the multiplier 15, where they are combined to form a real-valued digital output signal 17.

The multiplier 15 has a digital-to-analog converter 24 connected downstream from it. The real-valued digital output signal 17 of the multiplier 15 at the same time is the digital input signal of the digital-to-analog converter 24, which generates an analog signal 25 therefrom.

The amplifier device 1 further comprises a comparator connected downstream from the digital-to-analog converter 24. The analog output signal 25 of the digital-to-analog converter 24 at the same time is the input signal of the comparator 16 connected downstream, which therefrom generates the binary time-continuous input signal 4 of the power amplifier 3. The binary signal 4 is binary in terms of the amplitude and is time-continuous. The binary signal 4 serves to control the power components of the power amplifier 3.

The power amplifier 3 generates an amplified output signal 20, which is an amplified version of the binary input signal 4.

The amplifier device 1 may further comprise a reconstruction filter 18. In the embodiment depicted in FIG. 3, said reconstruction filter 18 is a low-pass filter 18 connected downstream from the power amplifier 3. Within the reconstruction filter 18, the binary signal 20 is reconstructed to form an output signal 23. If the input signal 2 equals Z(t) and the carrier frequency equals $f_c$, the output signal 23 will have the following signal shape without any further amplification factor:

$$Re\{Z(t)\}*Im\{e^{j2\pi f_c t}\}+Im\{Z(t)\}*Re\{e^{j2\pi f_c t}\}=Im\{Z(t)*e^{j2\pi f_c t}\}$$

In accordance with the embodiment depicted, the reconstruction filter 18, therefore, is serially connected downstream from the power amplifier 3, and the input signal 20 of the reconstruction filter 18 is the amplified output signal 20 generated by the power amplifier 3. According to the invention, the out-of-band signal portion of the amplified binary signal 20 is thus filtered out.

Generally, the amplified binary signal 20 consists of an inband signal portion and an out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated at the carrier frequency fc, of the base band input signal 2 of the entire inventive device 1.

As shown in FIGS. 1 to 3, the real part 21 and the imaginary part 22 of the input signal 22 are independently of each other coded in the output signals 8, 9 of the adding device 6 and are subsequently linearly superposed again at the output. Their information are separately inserted in the respective zero crossings of the real part 8 and of the imaginary part 9, respectively. Since said zero crossings are mutually interlaced, the multiplier 15 and the comparator 16 of the combination device 7 may be replaced by two comparators together with an XOR gate. The zero crossings of both signals are initially detected by means of the comparators and are then combined within the binary input signal 4 of the power amplifier 3 by means of the XOR gate. Such an embodiment is depicted with reference to FIG. 4.

Figure 4:
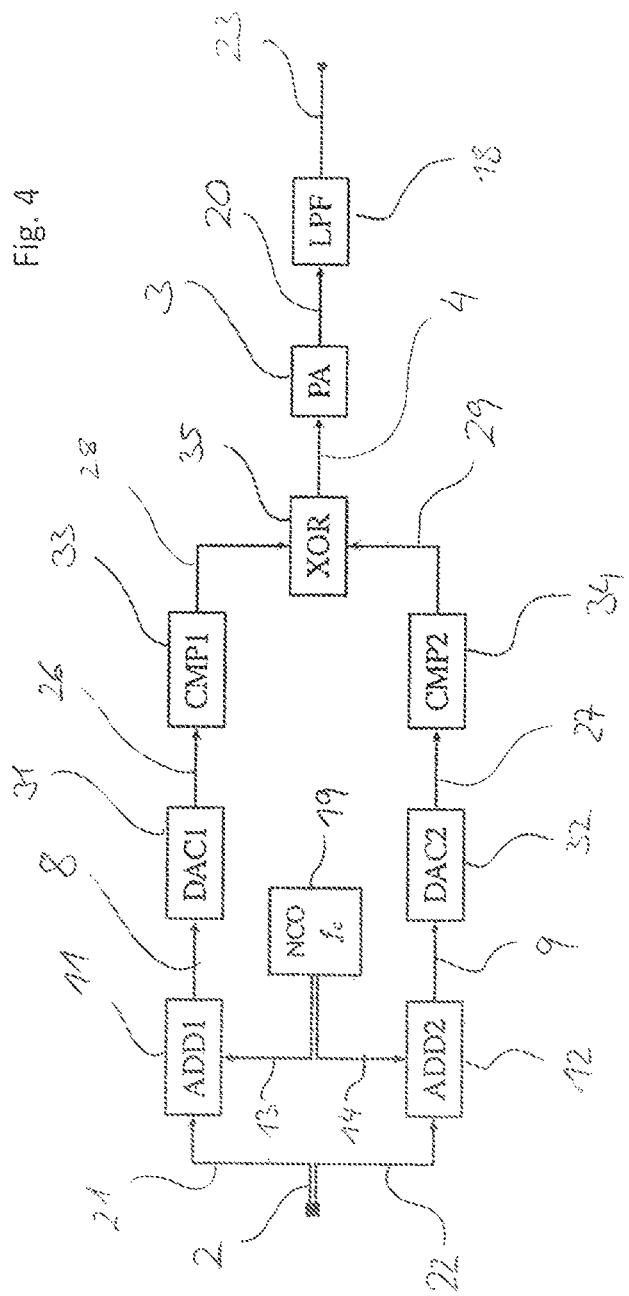
FIG. 4 shows a schematic block diagram of a third embodiment of the inventive device.

FIG. 4 shows a third embodiment of the inventive device 1.

The device 1 comprises an oscillator 19 for generating a digital mixed signal, or carrier signal, of the carrier frequency fc. The mixed signal comprises a real part 13 and an imaginary part 14.

The adding device 6 comprises a first adder 11 and a second adder 12.

The combination device 7 comprises a first digital-to-analog converter 32, a second digital-to-analog converter 32, a first comparator 33, a second comparator 34, and a logical XOR gate 35.

The first digital-to-analog converter 31 and the first comparator 33 are provided for processing the real part 21 of the input signal 2. The second digital-to-analog converter 32 and the second comparator 34 are provided for processing the imaginary part 22 of the input signal 2.

The first digital-to-analog converter 31 is serially connected downstream from the first adder 11. The first comparator 33 is serially connected downstream from the first digital-to-analog converter 31.

The second digital-to-analog converter 32 is serially connected downstream from the second adder 12. The second comparator 34 is serially connected downstream from the second digital-to-analog converter 32.

The outputs of the first comparator 33 and of the second comparator 34, respectively, are merged within the serially downstream-connected logical XOR gate 35 and are logically linked to each other.

The input signal 2 is complex-valued and comprises a real part 21 and an imaginary part 22. The input signal 2 may be time-continuous or time-discrete. In the third embodiment described with reference to FIG. 4, the input signal 2 is a complex-valued time-discrete signal.

The first adder 11 is configured to add the real part 21 of the input signal 2 to the real part 13 of the carrier signal. Thus, the real part 8 of a resulting modulated signal is obtained at the output of the first adder 11.

The second adder 12 is configured to add the imaginary part 22 of the input signal 2 to the imaginary part 14 of the carrier signal. Thus, the imaginary part 9 of a resulting modulated signal is obtained at the output of the second adder 12.

The output signal of the first adder 11, i.e., the digital modulated signal 8, is forwarded into the first digital-to-analog converter 31, where it is converted to an analog signal 26. The analog signal 26 is the input signal of the first comparator 33. The first comparator 33 is configured to convert the analog input signal 26 to an analog binary signal 28.

The output signal of the second adder 12, i.e., the digital modulated signal 9, is forwarded into the second digital-to-analog converter 32, where it is converted to an analog signal 27. The analog signal 27 is the input signal of the second comparator 34. The second comparator 34 is configured to convert the analog input signal 27 to an analog binary signal 29.

The output signals 28, 29 of the first comparator 33 and of the second comparator 34, respectively, are merged within the downstream-connected logical XOR gate 35. The XOR gate 35 generates the binary input signal 4 of the power amplifier 3. The binary signal 4 is binary in terms of the amplitude and is time-continuous. The binary signal 4 serves to control the power components of the power amplifier 3.

The power amplifier 3 generates an amplified output signal 20, which is an amplified version of the binary input signal 4.

The amplifier device 1 may further comprise a reconstruction filter 18. In the embodiment depicted in FIG. 4, said reconstruction filter 18 is a low-pass filter 18 connected downstream from the power amplifier 3. Within the reconstruction filter 18, the binary signal 20 is reconstructed to form an output signal 23. If the input signal 2 equals Z(t) and the carrier frequency equals $f_c$, the output signal 23 will have the following signal shape without any further amplification factor:

$$Re\{Z(t)\}*Im\{e^{j2\pi f_c t}\}+Im\{Z(t)\}*Re\{e^{j2\pi f_c t}\}=Im\{Z(t)*e^{j2\pi f_c t}\}$$

In accordance with the embodiment depicted, the reconstruction filter 18, therefore, is serially connected downstream from the power amplifier 3, and the input signal 20 of the reconstruction filter 18 is the amplified output signal 20 generated by the power amplifier 3. According to the invention, the out-of-band signal portion of the amplified binary signal 20 is thus filtered out.

Generally, the amplified binary signal 20 consists of an inband signal portion and an out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated at the carrier frequency fc, of the base band input signal 2 of the entire inventive device 1.

In the device of FIG. 4, the input signal 2 may be analog. In this case, the oscillator 19 would be an analog oscillator for generating an analog carrier signal of the carrier frequency $f_c$, and the first and second digital-to-analog converters 31, 32 might be dispensed with.

Figure 5:
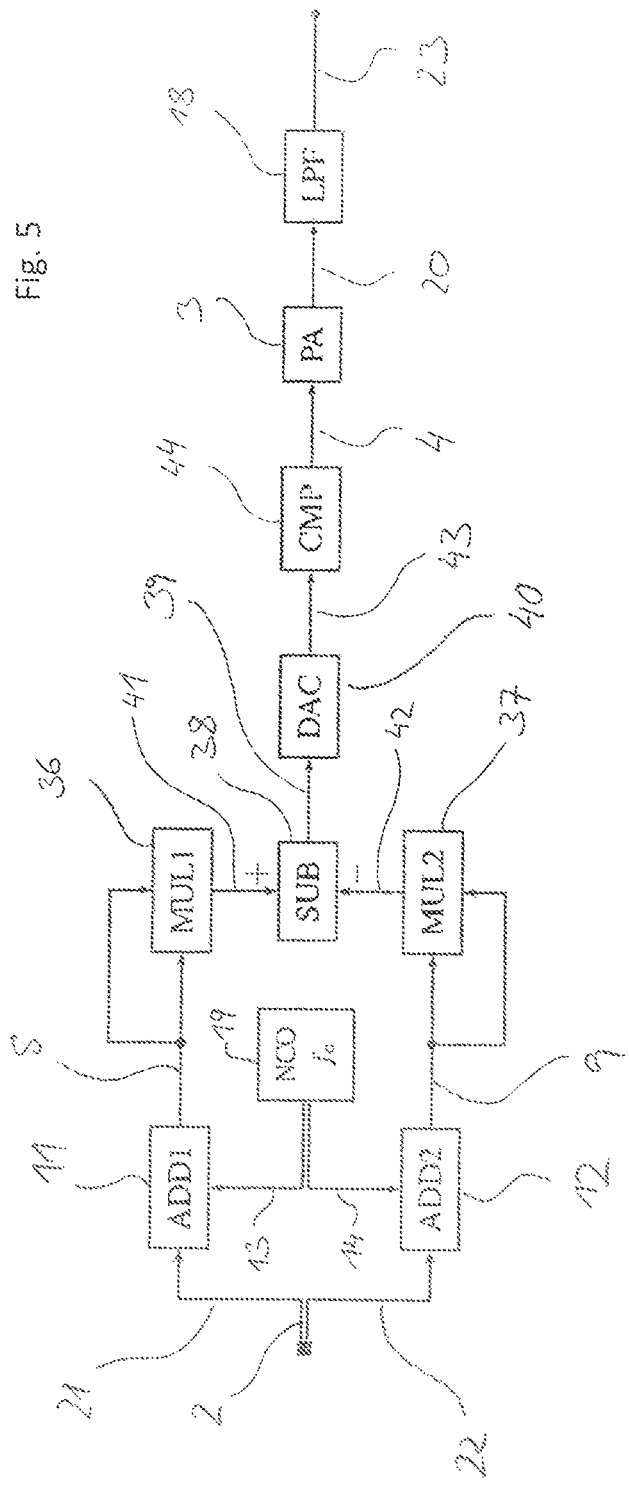
FIG. 5 shows a schematic block diagram of a fourth embodiment of the inventive device.

FIG. 5 shows a fourth embodiment of the inventive device 1.

The input signal 2 is complex-valued and comprises a real part 21 and an imaginary part 22. The input signal 2 may be time-continuous or time-discrete. In the fourth embodiment described with reference to FIG. 5, the input signal 2 is a complex-valued time-discrete signal.

The device 1 comprises a numerical oscillator 19 for generating a digital mixed signal, or carrier signal, of the carrier frequency fc. The mixed signal comprises a real part 13 and an imaginary part 14.

The adding device 6 comprises a first adder 11 and a second adder 12.

The combination device 7 comprises a first multiplier 36, a second multiplier 37, and a subtractor 38.

The first multiplier 36 is provided for processing the real part 21 of the input signal 2. The second multiplier 37 is provided for processing the imaginary part 22 of the input signal 2.

The first multiplier 36 is serially connected downstream from the first adder 11. The second multiplier 37 is serially connected downstream from the second adder 12.

The outputs of the first multiplier 36 and of the second multiplier 37, respectively, are merged within a serially downstream-connected subtractor 38 and are subtracted.

The first adder 11 is configured to add the real part 21 of the input signal 2 to the real part 13 of the carrier signal. Thus, the real part 8 of a resulting modulated signal is obtained at the output of the first adder 11.

The second adder 12 is configured to add the imaginary part 22 of the input signal 2 to the imaginary part 14 of the carrier signal. Thus, the imaginary part 9 of a resulting modulated signal is obtained at the output of the second adder 12.

The output signal of the first adder 11, i.e., the digital modulated signal 8, is multiplied by itself within the first multiplier 36. The output signal 41 of the first multiplier 36 thus is the square of the modulated digital signal 8.

The output signal of the second adder 12, i.e., the digital modulated signal 9, is multiplied by itself within the second multiplier 37. The output signal 42 of the second multiplier 37 thus is the square of the modulated digital signal 9.

The digital signal 41 at the output of the first multiplier 36 as well as the digital signal 42 at the output of the second multiplier 37 are merged within the subtractor 38. In the present embodiment, the signal portion 42 is subtracted from the signal portion 41.

The combined digital signal 39, which at the same time is the input signal of the serially downstream-connected digital-to-analog converter 40, is output at the output of the subtractor 38.

The digital-to-analog converter 40 converts the digital input signal 39 to an analog output signal 43, which at the same time is the input signal of the serially downstream-connected comparator 44.

The comparator 44 generates the time-continuous binary input signal 4 of the power amplifier 3 from the time-continuous input signal 43. The binary signal 4 is binary in terms of the amplitude and is time-continuous. The binary signal 4 serves to control the power components of the power amplifier 3.

The power amplifier 3 generates an amplified output signal 20, which is an amplified version of the binary input signal 4.

The amplifier device 1 may further comprise a reconstruction filter 18. In the embodiment depicted in FIG. 5, said reconstruction filter 18 is a low-pass filter 18 connected downstream from the power amplifier 3. Within the reconstruction filter 18, the binary signal 20 is reconstructed to form an output signal 23. If the input signal 2 equals Z(t) and the carrier frequency equals $f_c$, the output signal 23 will have the following signal shape without any further amplification factor:

$$Re\{Z(t)\}*Im\{e^{j2\pi f_c t}\}+Im\{Z(t)\}*Re\{e^{j2\pi f_c t}\}=Im\{Z(t)*e^{j2\pi f_c t}\}$$

In accordance with the embodiment depicted, the reconstruction filter 18, therefore, is serially connected downstream from the power amplifier 3, and the input signal 20 of the reconstruction filter 18 is the amplified output signal 20 generated by the power amplifier 3. According to the invention, the out-of-band signal portion of the amplified binary signal 20 is thus filtered out.

Generally, the amplified binary signal 20 consists of an inband signal portion and an out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated at the carrier frequency fc, of the base band input signal 2 of the entire inventive device 1.

Figure 6:
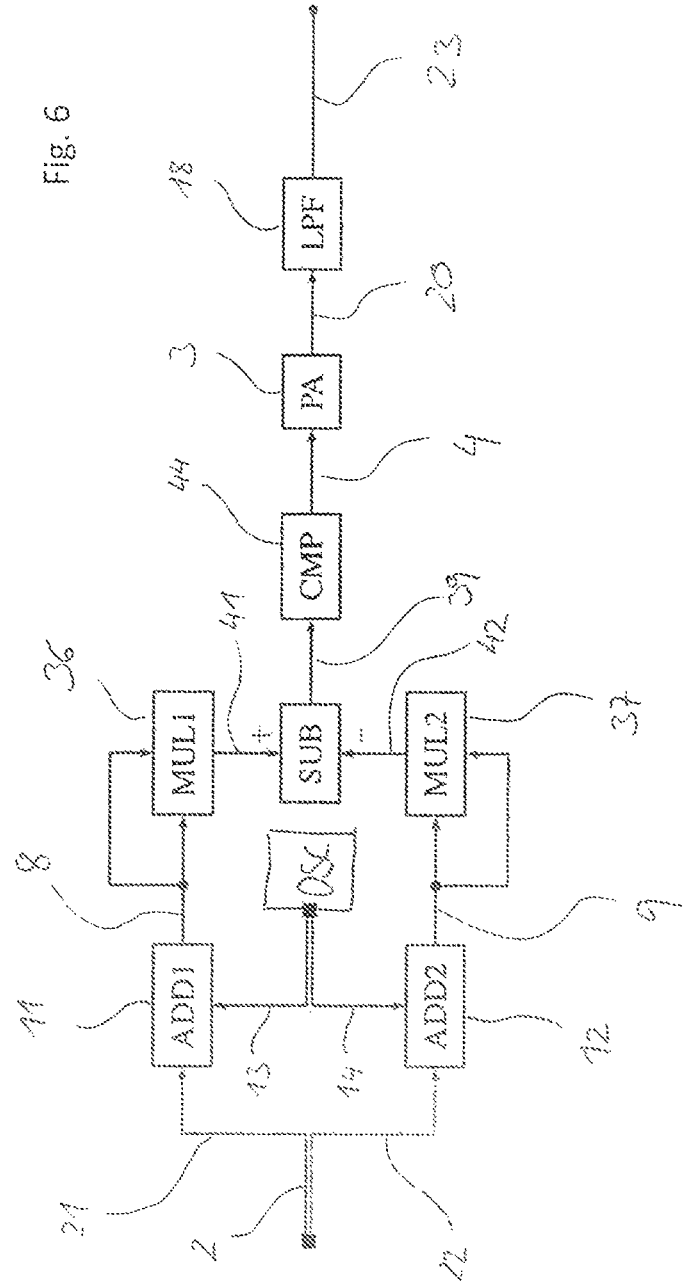
FIG. 6 shows a schematic block diagram of a fifth embodiment of the inventive device.

FIG. 6 shows a fifth embodiment of the inventive device 1.

The fifth embodiment essentially corresponds to the fourth embodiment described with reference to FIG. 5, the difference being that the input signal 2 is a time-continuous input signal.

Accordingly, the signals, or, signal portions, 21, 22, 8, 9, 41 and 42 are already present in an analog form. Thus, the digital-to-analog converter 40 within the combination device 7 is dispensed with as compared to the fourth embodiment. In addition, generation of the analog output signal 43 is dispensed with since the output signal 39 of the subtractor 38 is directly forwarded into the comparator 44.

The comparator 44 generates the time-continuous binary input signal 4 of the power amplifier 3 from the time-continuous input signal 39, which here corresponds to the output signal of the subtractor 38. The binary signal 4 is binary in terms of the amplitude and is time-continuous. The binary signal 4 serves to control the power components of the power amplifier 3.

The power amplifier 3 generates an amplified output signal 20, which is an amplified version of the binary input signal 4. The amplified binary signal 20 consists of the inband signal portion and the out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated at the carrier frequency fc, of the base band input signal 2 of the entire system 1. In other words, the output signal of the entire system is the amplified HF signal of the carrier frequency $f_c$.

The amplifier device 1 may further comprise a reconstruction filter 18. In the embodiment depicted in FIG. 6, said reconstruction filter 18 is a low-pass filter 18 connected downstream from the power amplifier 3. Within the reconstruction filter 18, the binary signal 20 is reconstructed to form an output signal 23. If the input signal 2 equals Z(t) and the carrier frequency equals $f_c$, the output signal 23 will have the following signal shape without any further amplification factor:

$$Re\{Z(t)\}*Im\{e^{j2\pi f ct}\}+Im\{Z(t)\}*Re\{e^{j2\pi f ct}\}=Im\{Z(t)*e^{j2\pi f ct}\}$$

In accordance with the embodiment depicted, the reconstruction filter 18, therefore, is serially connected downstream from the power amplifier 3, and the input signal 20 of the reconstruction filter 18 is the amplified output signal 20 generated by the power amplifier 3. According to the invention, the out-of-band signal portion of the amplified binary signal 20 is thus filtered out.

Generally, the amplified binary signal 20 consists of an inband signal portion and an out-of-band signal portion. The out-of-band signal portion is filtered out by the reconstruction filter 18. The inband signal portion is exclusively the real-valued output signal 23 of the entire system 1. In other words, the inband signal portion of the amplified binary signal 20 is an amplified version, upward-modulated at the carrier frequency fc, of the base band input signal 2 of the entire inventive device 1.

All of the described inventive switching amplifier structures may theoretically be implemented in an either purely digital or purely analog form. However, it is useful to operate the system in a partly digital and a partly analog manner.

The digital-to-analog converters 31, 32 of the third embodiment depicted in FIG. 4 may be operated at a low cutoff frequency f>$f_c$, whereas the digital-to-analog converter 40 of the fourth embodiment depicted in FIG. 5 may expediently be operated at a higher cutoff frequency f>$2f_c$.

The inventive amplifier system 1 in accordance with the first embodiment consists of a modulation block 5, a power amplifier 3 and an optional reconstruction filter 18. The modulation block 5 combines two adders 11, 12, a multiplier 15 and a signal comparator 16. The input signal 2 is a complex-valued base band signal, and the input signal 4 of the power amplifier 3 is a modulated real-valued binary signal for controlling an amplifier element such as a transistor, for example. The output signal 23 of the entire system 1 is the amplified HF signal of the carrier frequency $f_c$.

In accordance with the invention, the real and imaginary parts 21, 22 of the input signal 2 may be coded and amplified separately from each other.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed by a hardware device (or while using a hardware device), such as a microprocessor, a programmable computer or an electronic circuit. In some embodiments, some or several of the most important method steps may be performed by such a device.

The inventive coded signal may be stored on a digital storage medium or may be transmitted via a transmission medium such as a wireless transmission medium or a wired transmission medium, e.g. the Internet, for example.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or actually do cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. Said transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A device for amplifying an input signal, comprising:
   a power amplifier for amplifying a binary input signal,
   a modulation device for generating the binary input signal on the basis of the input signal,
   the input signal being a complex-valued signal and the binary input signal being a real-valued signal,
   the modulation device comprising an adding device configured to add the complex-valued input signal to a complex-valued carrier signal of a predefined frequency and to thus generate a resulting complex-valued signal, and
   the modulation device further comprising a combination device connected downstream from the adding device and configured to generate the real-valued binary input signal from the real part and the imaginary part of the resulting complex-valued signal by combining the real part and the imaginary part of the resulting complex-valued signal,
   wherein the combination device comprises a multiplier and a serially downstream-connected comparator, the multiplier being configured to combine the real part and the imaginary part of the resulting complex-valued signal to form an analog combined signal, and the comparator being configured to convert said analog combined signal to the binary time-continuous input signal of the power amplifier.

2. The device as claimed in claim 1, the device comprising a reconstruction filter, in particular a low-pass filter, the reconstruction filter being serially connected downstream from the power amplifier, and the input signal of the reconstruction filter being an amplified output signal generated by the power amplifier.

3. The device as claimed in claim 1, wherein the adding device comprises a first adder and a second adder, the first adder being configured to combine the real part of the input signal with the real part of the complex-valued carrier signal to form a real part of the resulting complex-valued signal, and the second adder being configured to combine the imaginary part of the input signal with the imaginary part of the complex-valued carrier signal to form an imaginary part of the resulting complex-valued signal.

4. The device as claimed in claim 1, wherein the complex-valued input signal is an analog signal and the device comprises an analog oscillator for generating the complex-valued carrier signal.

5. A device for amplifying an input signal, comprising:
   a power amplifier for amplifying a binary input signal,
   a modulation device for generating the binary input signal on the basis of the input signal,
   the input signal being a complex-valued signal and the binary input signal being a real-valued signal,
   the modulation device comprising an adding device configured to add the complex-valued input signal to a complex-valued carrier signal of a predefined frequency and to thus generate a resulting complex-valued signal, and
   the modulation device further comprising a combination device connected downstream from the adding device and configured to generate the real-valued binary input signal from the real part and the imaginary part of the resulting complex-valued signal by combining the real part and the imaginary part of the resulting complex-valued signal,
   wherein the complex-valued input signal is a digital signal, and the device comprises a digital oscillator for generating the complex-valued carrier signal, and
   wherein the combination device comprises a multiplier, a downstream-connected comparator and a series connection comprising a digital-to-analog converter arranged therebetween, the multiplier being configured to combine the real part and the imaginary part of the resulting complex-valued signal to form a digital output signal, the digital-to-analog converter being configured to convert the digital output signal of the multiplier to an analog signal, and the comparator being configured to convert the analog output signal of the digital-to-analog converter to the binary time-continuous input signal of the power amplifier.

6. A device for amplifying an input signal, comprising:
   a power amplifier for amplifying a binary input signal,
   a modulation device for generating the binary input signal on the basis of the input signal,
   the input signal being a complex-valued signal and the binary input signal being a real-valued signal,
   the modulation device comprising an adding device, the adding device comprising a first adder and a second adder and being configured to add the complex-valued input signal to a complex-valued carrier signal of a predefined frequency and to thus generate a resulting complex-valued signal, and
   the modulation device further comprising a combination device connected downstream from the adding device and configured to generate the real-valued binary input signal from the real part and the imaginary part of the resulting complex-valued signal by combining the real part and the imaginary part of the resulting complex-valued signal, wherein the complex-valued input signal is a digital signal, and the device comprises a digital oscillator for generating the complex-valued carrier signal, and wherein the combination device comprises first and second digital-to-analog converters, the first digital-to-analog converter being serially connected downstream from the first adder and configured to convert the real part of a digital resulting signal to an analog real-valued signal, and the second digital-to-analog converter being serially connected downstream from the second adder and configured to convert the imaginary part of a digital resulting signal to an analog signal.

7. The device as claimed in claim 6, wherein the combination device further comprises first and second comparators, the first comparator being serially connected downstream from the first digital-to-analog converter and the second comparator being serially connected downstream from the second digital-to-analog converter, and the first comparator being configured to convert the real part of an analog resulting signal to a first real-valued binary time-continuous signal, and the second comparator being configured to convert the imaginary part of an analog resulting signal to a second real-valued binary time-continuous signal.

8. The device as claimed in claim 7, wherein the combination device comprises a logical XOR circuit connected downstream from both comparators and configured to logically link the first real-valued binary time-continuous signal resulting from the real part and the second real-valued binary time-continuous signal resulting from the imaginary part with each other such that the output signal of the XOR circuit is the binary time-continuous input signal of the power amplifier.

9. A device for amplifying an input signal, comprising:
a power amplifier for amplifying a binary input signal,
a modulation device for generating the binary input signal on the basis of the input signal,
the input signal being a complex-valued signal and the binary input signal being a real-valued signal,
the modulation device comprising an adding device, the adding device comprising a first adder and a second adder and being configured to add the complex-valued input signal to a complex-valued carrier signal of a predefined frequency and to thus generate a resulting complex-valued signal, and the modulation device further comprising a combination device connected downstream from the adding device and configured to generate the real-valued binary input signal from the real part and the imaginary part of the resulting complex-valued signal by combining the real part and the imaginary part of the resulting complex-valued signal, wherein the complex-valued input signal is a digital signal, and the device comprises a digital oscillator for generating the complex-valued carrier signal, and wherein the combination device comprises first and second multipliers, the first multiplier being serially connected downstream from the first adder, and the second multiplier being serially connected downstream from the second adder, and the first multiplier being configured to temporally multiply a time-discrete output signal, formed from the real part, of the first adder by itself, and the second multiplier being configured to temporally multiply a time-discrete output signal, formed from the imaginary part, of the second adder by itself.

10. The device as claimed in claim 9, wherein the combination device comprises a subtractor connected downstream from both multipliers and configured to form a difference from the square of the real part and the square of the imaginary part, so that a real-valued digital output signal is generated.

11. The device as claimed in claim 10, wherein the combination device comprises a comparator serially connected downstream from the subtractor and a digital-to-analog converter arranged between the subtractor and the comparator, the digital-to-analog converter being configured to convert the real-valued digital output signal of the subtractor to an analog signal, and the comparator being configured to convert the analog output signal of the digital-to-analog converter to the binary input signal of the power amplifier.

* * * * *